(12) United States Patent
Wight

(10) Patent No.: US 7,733,976 B2
(45) Date of Patent: *Jun. 8, 2010

(54) COMPUTATIONAL CIRCUITS AND METHODS FOR PROCESSING MODULATED SIGNALS HAVING NON-CONSTANT ENVELOPES

(76) Inventor: James Stuart Wight, 300 Queen Elizabeth Drive, Apt. 9A, Ottawa, Ontario K1V 3M6 (CA)

( * ) Notice: Subject to any disclaimer, the term of this patent is extended or adjusted under 35 U.S.C. 154(b) by 10 days.

This patent is subject to a terminal disclaimer.

(21) Appl. No.: 11/469,062

(22) Filed: Aug. 31, 2006

(65) Prior Publication Data

US 2007/0201353 A1    Aug. 30, 2007

Related U.S. Application Data

(63) Continuation of application No. 10/205,743, filed on Jul. 26, 2002, now Pat. No. 7,127,005, which is a continuation-in-part of application No. 09/918,106, filed on Jul. 30, 2001, now abandoned.

(60) Provisional application No. 60/277,941, filed on Mar. 23, 2001.

(51) Int. Cl.
   *H04L 27/04* (2006.01)
(52) U.S. Cl. .................... 375/295; 375/297
(58) Field of Classification Search ............. 375/222, 375/260, 261, 271, 276, 284, 285, 295, 296, 375/302, 280, 297; 370/206, 216, 217, 218, 370/221, 225, 227, 430, 210, 203, 208, 481; 330/10, 2, 124 R
See application file for complete search history.

(56) References Cited

U.S. PATENT DOCUMENTS 5,467,367 A    11/1995   Izumi et al.

(Continued)

FOREIGN PATENT DOCUMENTS

CA         2064975        7/1999

(Continued)

OTHER PUBLICATIONS

Babak et al., "Performance and Implementation of Clustered-OFDM for Wireless Communications", pp. 1-17.

(Continued)

*Primary Examiner*—Chieh M Fan
*Assistant Examiner*—Aristocratis Fotakis
(74) *Attorney, Agent, or Firm*—Stolowitz Ford Cowger LLP

(57) ABSTRACT

Circuits and methods are provided for use in a wireline or wireless transmitter to complement the digital generation of non-constant envelope modulation signals therein. A digital signal processor is configured for deconstructing a predetermined signal having an undesirable property into one or more fragment signals which do not have the undesirable property. In a preferred embodiment the predetermined signal is preconditioned by applying a preconditioning deconstruction process to another signal from which the predetermined signal is derived, whereby that other signal is deconstructed into one or more preconditioned fragment signals having an improved property over the other signal. For OFDM modulation schemes this undesirable property may be a relatively high peak-to-average power ratio. Signals formed from the fragment signals are subject to conversion to analog signals and processing by power efficient, dynamic-range limited analog circuits i.e. S Class power amplifiers (and, for wireless applications, low compression-point up-converters), before being recombined for transmission.

39 Claims, 11 Drawing Sheets

U.S. PATENT DOCUMENTS

| | | | |
|---|---|---|---|
| 5,539,775 A | 7/1996 | Tuttle et al. | |
| 5,598,154 A | 1/1997 | Wilson et al. | |
| 5,623,485 A | 4/1997 | Bi | |
| 5,636,247 A | 6/1997 | Kamerman et al. | |
| 5,659,272 A * | 8/1997 | Linguet | 332/151 |
| 5,666,383 A * | 9/1997 | Huang et al. | 375/260 |
| 5,687,166 A | 11/1997 | Natali et al. | |
| 5,771,224 A | 6/1998 | Seki et al. | |
| 5,838,717 A | 11/1998 | Ishii et al. | |
| 5,848,107 A | 12/1998 | Philips | |
| 5,862,457 A * | 1/1999 | Winters | 455/103 |
| 5,990,738 A * | 11/1999 | Wright et al. | 330/149 |
| 6,128,350 A | 10/2000 | Shastri et al. | |
| 6,147,553 A * | 11/2000 | Kolanek | 330/10 |
| 6,175,550 B1 | 1/2001 | Van Nee | |
| 6,175,551 B1 | 1/2001 | Awater et al. | |
| 6,178,158 B1 * | 1/2001 | Suzuki et al. | 370/203 |
| 6,198,764 B1 | 3/2001 | Schuermann et al. | |
| 6,205,220 B1 | 3/2001 | Jacobsen et al. | |
| 6,215,813 B1 | 4/2001 | Jones et al. | |
| 6,252,908 B1 | 6/2001 | Tore | |
| 6,424,681 B1 | 7/2002 | Tellado et al. | |
| 6,556,557 B1 * | 4/2003 | Cimini et al. | 370/342 |
| 6,690,233 B2 * | 2/2004 | Sander | 330/124 R |
| 6,747,946 B1 * | 6/2004 | Kaneko et al. | 370/206 |
| 6,751,267 B1 | 6/2004 | Schill et al. | |
| 6,845,082 B2 | 1/2005 | Bourget et al. | |
| 6,928,084 B2 * | 8/2005 | Cimini et al. | 370/430 |
| 7,002,904 B2 * | 2/2006 | Jung | 370/210 |
| 7,042,927 B2 | 5/2006 | Wight | |
| 7,127,005 B2 * | 10/2006 | Wight | 375/295 |
| 7,342,978 B2 * | 3/2008 | Feng et al. | 375/295 |
| 2002/0047745 A1 * | 4/2002 | Kolanek | 330/149 |
| 2002/0061068 A1 | 5/2002 | Leva et al. | |
| 2003/0043933 A1 | 3/2003 | Kintis | |

FOREIGN PATENT DOCUMENTS

| | | |
|---|---|---|
| DE | 19744428 | 2/1999 |
| EP | 0735731 A2 | 10/1996 |
| EP | 0562529 | 2/1999 |
| EP | 0735731 A3 | 9/2000 |
| EP | 1195962 A | 4/2002 |
| JP | 8-274748 | 10/1996 |
| WO | 03077490 | 9/2003 |

OTHER PUBLICATIONS

Sundstrom, "The Effect of Quantization in a Digital Signal Component Separator for LINC Transmitters", IEEE Transactions on Vehicular Technology, vol. 45, No. 2, May 1996, pp. 346-352.

Haskins, "Diode Predistortion Linearization for Power Amplifier RFICs in Digital Radios", Thesis submitted to the faculty of the Virginia Polytechnic Institute and State University, Apr. 17, 2000, Blacksburg, VA.

Stengel et al., "LINC Power Amplifier Combiner Method Efficiency Optimization", IEEE Transactions on Vehicular Technology, vol. 49, No. 1, Jan. 2000, pp. 229-234.

Casadevall et al., "Performance Analysis of QAM Modulations Applied to the LINC Transmitter", IEEE Transactions on Vehicular Technology, vol. 42, No. 4, Nov. 1993, pp. 399-406.

Sundstrom, "Digital RF Power Amplifier Linearisers, Analysis and Design", Department of Applied Electronics, Lund University, Aug. 1995.

Shi et al., "A 200MHz IF BiCMOS Chip for Linear LINC Transmitters", Analog and RF Group, CCCD, Department of Applied Electronics, Lund University, undated.

Xhang et al., "Gain and Phase Error-Free LINC Transmitter", IEEE Transactions on Vehicular Technology, vol. 49, No. 5, Sep. 2000, pp. 1986 to 1994.

Sundstrom, "Spectral Sensitivity of LINC Transmitters to Quadrature Modulator Misalignments", IEEE Transactions on Vehicular Technology, vol. 49, No. 4, Jul. 2000, pp. 1474 to 1487.

Sundstrom et al., "Quantization Analysis and Design of a Digital Predistortion Linearizer for RF Power Amplifiers", IEEE Transactions on Vehicular Technology, vol. 45, No. 4, Nov. 1996, pp. 707-719.

Langridge et al., "A Power Re-Use Technique for Improved Efficiency of Outphasing Microwave Power Amplifiers", IEEE Transactions on Microwave Theory and Techniques, vol. 47, No. 8, Aug. 1999, pp. 1467 to 1470.

Sundstrom et al., "Effects of Reconstruction Filters in Digital Predistortion Linearizers for FR Power Amplifiers", IEEE Transactions on Vehicular Technology, vol. 44, No. 1, Feb. 1995, pp. 131 to 139.

Cox, "Linear Amplification with Nonlinear Components", IEEE Transactions on Communications, Dec. 1974, pp. 1942 to 1945.

Tufvesson et al., "Preamble-based Time and Frequency Synchronization for OFDM Systems". Department of Applied Electronics, Lund University, Sweden, Sep. 1999.

Jankiraman et al., "A Novel Algorithmic Synchronisation Technique for OFDM based Wireless Multimedia Communications", Centre for Wireless Personal Communication, IRCTR, Telecommunications and Traffic Systems Group, Faculty of Information Technology and Systems, Delft University of Technology, undated.

Eberlee et al., A Digital 72Mb/s 64-QAM OFDM Transceiver for 5GHz Wireless LAN in 0.18 μm CMOS, ISSCC 2001/Session 21/Signal Processing for Communications, Feb. 7, 2001.

Lee et al., "A New Symbol Timing Recovery Algorithm for OFDM Systems", Department of Electronic and Electrical Engineering, Pohang University of Science and Technology, Undated.

Li et al., "Carrier Frequency Offset Estimation for OFDM-Based WLANs", IEEE Signal Processing Letters, vol. 8, No. 3, Mar. 2001, pp. 80-82.

Torrance et al., "Comparative Study of Pilot Symbol Assisted Modem Schemes", Proceedings of Radio Receivers and Associated Systems Conference, RRAS '95, Sep. 26-28, 1995, Bath, UK, pp. 36-41.

Hsu et al., Design of an OFDM Receiver for High-Speed Wireless LAN, Department of Electrical Engineering and Graduate Institute of Electronic Engineering, National Taiwan University, 2001.

Gardner, "Interpolation in Digital Modems—Part 1: Fundamentals", IEEE Transactions on Communications, vol. 41, No. 3, Mar. 1993, pp. 501 to 507.

Hetzel et al., "LINC Transmitter", Electronics Letters, May 9, 1991, vol. 27, No. 10, Feb. 28, 1991, pp. 844 to 846.

Huq et al., "ML NDA Carrier Phase Recovery for OFDM Systems", Texas Instruments, Inc., Semiconductor Group, DSP Applications, and Department of Electrical Engineering, Texas A&M University, Undated.

Matić et al., "OFDM Synchronisation based on the Phase Rotation of Sub-carriers", Telecommunications and Traffic Control System Group, Delft University of Technology, the Netherlands; International Research Centre of Telecommunication and Radar, Delft University of Technology, the Netherlands; Research Centre of Telecommunications, Hilversum, the Netherlands; Aalborg University, Aalborg, Denmark; I2S-CNRS, University of Sophia-Antipolis, France, Undated.

Van De Beek et al., "A Time and Frequency Synchronization Scheme for Multiuser OFDM", paper presented in part at the 48th IEEE Vehicular Technology Conference, VTC '98, May 18-21, Ottawa, Ontario, Canada.

Dr. A Bateman, "The Combined Analogue Locked Loop Universal Modulator (CALLUM)", Centre for Communications Research, University of Bristol, 1992.

Erup et al., "Interpolation in Digital Modems—Part III: Implementation and Performance", IEEE Transactions on Communications, vol. 41, No. 6, Jun. 1993, pp. 998-1008.

Warner et al., "OFDM/FM Frame Synchronization for Mobile Radio Data Communication", IEEE Transactions on Vehicular Technology, vol. 42, No. 3, Aug. 1993, pp. 302 to 313.

PCT International Search Report for International Application No. PCT/CA02/01174.

Cimini et al., "Peak-to-Average Power Ratio Reduction of an OFDM Signal Using Partial Transmit Sequences", IEEE International Conference on Communications, vol. 1, Jun. 6-10, 1999, pp. 511-515.

Daneshrad et al., "Performance and Implementation of Clustered-OFDM for Wireless Communications", Mobile Networks and Applications, vol. 2, No. 4, 1997, pp. 305-314, Amsterdam, Netherlands.

Van Nee et al., "Reducing the Peak-to-Average Power Ratio of OFDM", 48$^{th}$ IEEE Vehicular Technology Conference, May 18-21, 1998, pp. 2072-2076, New York, U.S.

WIPO; International Bureau PCT serial No. PCT/CA02/01498; International Search Report; May 12, 2003; 3 Pages.

Rui Dinis et al., "Performance Trade-Offs with Quasi-Linearly Amplified OFDM Through a Two-Branch Combining Technique", CAPS Instituto Superior Tecnico, IEEE 1996, pp. 899-903.

* cited by examiner

PEAK-TO-AVERAGE RATIO

PEAK-TO-AVERAGE RATIO

SIGNAL AT TIME 1

SIGNAL AT TIME 2

SIGNAL AT TIME 1

SIGNAL AT TIME 2

SIGNAL AT TIME 1

SIGNAL AT TIME 2

COMPUTATIONAL CIRCUITS AND METHODS FOR PROCESSING MODULATED SIGNALS HAVING NON-CONSTANT ENVELOPES

CROSS-REFERENCE TO RELATED APPLICATIONS

The present application is a continuation of U.S. application Ser. No. 10/205,743 filed Jul. 26, 2002, now U.S. Pat. No. 7,127,005, which in turn is a continuation-in-part of U.S. application Ser. No. 09/918,106 filed Jul. 30, 2001, abandoned, which claims the benefit of U.S. Application No. 60/277,941 filed Mar. 23, 2001.

FIELD OF THE INVENTION

The invention relates to computational circuits and methods for improved processing of modulated signals having non-constant envelopes (e.g. multi-carrier or single carrier QAM) and, in particular, to circuits and methods for applying deconstruction algorithms to such modulated signals to produce deconstruction signals therefrom which have more desirable characteristics (e.g. reduced peak-to-average power ratios) for further processing prior to transmission.

BACKGROUND OF THE INVENTION

Non-constant envelope modulation schemes such as multi-carrier modulation schemes (e.g. orthogonal frequency division multiplex (OFDM)) and single carrier quadrature amplitude modulation (QAM)), are often realized by digitally generating these modulation signals (i.e. by computational means, typically a digital signal processor (DSP)). Such computational modulation is usefully employed in both wireless and wireline applications in which non-constant envelope modulation schemes are used. For example, a wireline application may be an xDSL transport system and a wireless (RF) application may be the 802.11a wireless LAN standard, or its variants, or Broadband Fixed Wireless Systems such as LMDS or MMDS. In such applications the data is typically scrambled, encoded, and interleaved before being modulated. In the case of wireless applications, the computational modulation is performed before the signal is fed to a digital-to-analog converter (DAC) and subsequently up-converted and amplified for wireless transmission.

Advantageously, computational modulation implementations enable more economical realizations of multi-carrier modulation and signal carrier QAM transceivers. As detailed herein, the inventor has discovered that such computational modulation environments provide a suitable framework in which to apply other pre-conditioning and/or complementary computations to the waveform before and/or after the modulation process is performed in order to achieve improved circuit performance. The terms "computational modulation" and "digitally generated modulation" are used interchangeably herein and the meaning of these terms used herein is intended to be the same viz. modulation performed by computational means.

The up-converter and power amplifier of an RF transmitter must perform the frequency shifting and amplification of the modulated carrier with a minimum of distortion. For traditional single carrier modulation schemes, this implies a reasonably low dynamic range for the up-converter and also a reasonably small power back-off (from a 1 dB compression point) for the power amplifier. However, in order to achieve a minimum of distortion in a multi-carrier OFDM or single carrier QAM modulation scheme, the up/down converters must have a very high dynamic range (i.e. they must be linear and, hence, must have a high compression point), and a large power back-off (e.g. 12 dB) for the power amplifier is required, due to the high peak-to-average power ratios encountered. Both the high dynamic range requirement and the large power back-off requirement result in a very high DC power consumption for the transmitter and this creates a disadvantage of both OFDM and QAM for wireless or wireline applications.

Known designs for the 802.11a 5 GHz wireless standard integrate the transmitter functions of scrambling, encoding, IFFT (Inverse Fast Fourier Transform) generation, modulating, up-converting, and power amplifying without directly addressing the problem of the high peak-to-average power ratio associated with OFDM modulation. There is a need, therefore, for 802.11a chip architectures that integrate the MAC, PHY and RF functions of the 802.11a, 5 GHz OFDM wireless standard and minimize the high dynamic range and large power back-off requirements. More specifically, for such wireless applications there is a need for circuitry which would enable the use of power efficient, dynamic-range limited RF circuits such as Class S power amplifiers (also referred to as Class D or Switch Mode power amplifiers) and low compression-point up-converters.

For wireline xDSL applications there is also a need to achieve greater power efficiency and it would be advantageous, for such applications, to provide means which would enable the use of a high efficiency amplifier stage (e.g. Class S).

OFDM and other related multi-carrier modulation schemes are based on repetitively assigning a multiple of symbols to a multiple of carrier frequencies and calculating the IFFT to obtain the sequential segments of the time waveform to be transmitted. A significant problem for OFDM modulation is the very high peak-to-average power ratio that may occur during the time sequence output for each IFFT operation. A peak will occur when a majority of the individual carrier frequencies line up in-phase (if a peak appears, it is unlikely that a second one will occur within the same IFFT time segment due to the relatively small number of time samples). In order to establish phase references for the demodulation decision, training tones are periodically spaced throughout the multiple of carrier frequencies.

For OFDM modulators the first few samples of the time sequence output for each IFFT operation make up a guard interval. The guard interval occurs during the time in which the multi-path channel is stabilizing. In order to have available the complete IFFT time sequence for the receiver to operate on, the first few samples are cyclically rotated and appended to the end of the IFFT. The time samples following the preamble are windowed with a weighting function in order to control frequency side-lobes. A typical weighting function is a trapezoidal waveform, having 1 time sample at both the beginning and end weighted to 0.5.

According to a known property of the Fourier transform pair, referred to as the shifting property, a shift in one domain corresponds to a complex rotation (phase shift) in the other domain. Further, for the FFT/IFFT realization, a progressive phase shift with respect to frequency in the frequency domain corresponds to a cyclic rotation of the corresponding time waveform segment.

SUMMARY OF THE INVENTION

The inventor has discovered that the performance of circuits used for digitally generating modulation signals is improved by utilizing the computational environment thereof, before and/or after the modulation of signals, to deconstruct signals having an undesirable property into one or more resulting signals which do not have such undesirable property. In particular, the inventor has developed improvements for the design of circuitry for computational non-constant envelope modulation schemes, whereby a modulation waveform is deconstructed into components which, individually, have low peak-to-average power ratios. Preferably, these deconstruction processes are performed by applying pre-conditioning and/or complementary computations to the waveform before and/or after the modulation process. Advantageously, these deconstruction processes produce waveforms having reduced peak to average power ratios and the circuits realizing these processes enjoy substantially reduced power consumption for up-conversion and power amplification. Surprisingly, in marked contrast to known circuits performing computational modulation, the modulated signals produced by the inventor's deconstruction processes are in form for further processing on the analog side of the transmitter by Class S power amplifiers and, in the case of wireless applications, by low compression-point up-converters.

In accordance with the invention there is provided a signal deconstruction circuit for use in a transmitter and configured for complementing modulation circuitry of the transmitter which digitally generates a non-constant envelope modulation signal. A digital signal processor is configured for deconstructing a predetermined signal having an undesirable property into one or more fragment (i.e. deconstruct) signals which do not have that undesirable property, whereby signals formed from the fragment signals are subject to conversion to analog signals and processing by power efficient, dynamic-range limited analog circuits prior to being recombined for transmission. The undesirable property may be a relatively high peak-to-average power ratio, such as for OFDM circuits. The modulation circuitry comprises an Inverse Fourier transform processor and the deconstruction circuit may be operative before or after the Inverse Fourier transform processor.

Several exemplary computational engines for signal processing in accordance with the invention are disclosed herein. These engines complement each other and enable circuit architectures to be implemented which benefit from a reduced circuit complexity and repetitive use, and provide improved power consumption performance. Advantageously, by deconstructing the modulation signal into components (i.e. fragment signals) having low peak-to-average power ratios, multiple identical analog circuits having low dynamic ranges and small power back-offs may be used (e.g. for an RF transmitter application, multiple identical up-converter/power amplifier circuits instead of a single high dynamic range up-converter and large power back-off amplifier). After the fragment signals have been processed by the analog circuits (e.g. up-converters and power amplifiers, for an RF transmitter, or amplifiers, for a wireline transmitter) they are recombined to form the modulation signal. This minimizes the complexity and performance requirements of the analog circuits, reduces DC power consumption and reduces the required number of external components.

In accordance with one aspect of the invention the deconstruction circuit may comprise a carrier-sorting engine configured to sort carriers of the predetermined signal into a plurality of groups, each group forming one fragment signal, whereby the modulation circuitry comprises a plurality of Inverse Fourier transform processors configured for transforming the fragment signals, each Inverse Fourier transform processor being smaller than would be required to transform the predetermined signal itself. In a preferred embodiment, the carriers may be simultaneously sorted in more than one way to produce a plurality of alternative fragment signals for each group, whereby the selection of the fragment signal is based on peak-to-average power ratio.

In accordance with another aspect of the invention the deconstruction circuit may comprise a phasor fragmentation engine configured to deconstruct the predetermined signal into a plurality of equal, varying amplitude fragment signals the phasors of which combine to form a phasor corresponding to the predetermined signal, the amplitude of the fragment signals being a predetermined proportion of the variation of the amplitude of the predetermined signal about the mean amplitude thereof. The phasor fragmentation engine converts sequences of complex time samples output from the Inverse Fourier transform processor into two parallel sequences of equal, varying magnitude phasors at two phases whereby the phases are calculated to be $\theta-\Phi$ and $\theta+\Phi$, whereby $\Phi=\cos^{-1}(0.5V/V_{PHASOR})$ wherein V is the amplitude of the current complex time sample of the predetermined signal and $V_{PHASOR}$ is the amplitude of the fragment signals calculated to be K1 V−K2 wherein K1 and K2 are constants.

In one embodiment the phasor fragmentation engine deconstructs the predetermined signal into a plurality of equal and constant amplitude fragment signals. Preferably, where the predetermined signal is deconstructed into two fragment signals, the predetermined signal is preconditioned by another deconstruction circuit operative prior to the Inverse Fourier transform processor. Such other deconstruction circuit may comprise a carrier sorting engine. Alternatively, the other deconstruction circuit may comprise a preconditioning phasor fragmentation engine for preconditioning another predetermined signal prior to the processing of the predetermined signal. In such embodiment the preconditioning phasor fragmentation engine deconstructs the other predetermined signal into a plurality of equal, varying amplitude preconditioned fragment signals the phasors of which combine to form a phasor corresponding to the other predetermined signal. The amplitude of the preconditioned fragment signals is a predetermined proportion of the variation of the amplitude of the other predetermined signal about the mean amplitude thereof.

In an embodiment of the phasor fragmentation engine which deconstructs the predetermined signal into two fragment signals the sequences of complex time samples output from the Inverse Fourier transform processor are converted into parallel sequences of two equal magnitude phasors, equal to Vmax/2, at two phases calculated to be $\theta-\Phi$ and $\theta+\Phi$, respectively, whereby $\Phi=\cos^{-1}(V/Vmax)$ and $\theta$ is the phase of the predetermined signal, with V being the amplitude of the current complex time sample of the predetermined signal and Vmax being the maximum amplitude of the predetermined signal over the period of the sequence.

In an embodiment of the phasor fragmentation engine which deconstructs the predetermined signal into three fragment signals the sequences of complex time samples output from the Inverse Fourier transform processor are converted into parallel sequences of three equal magnitude phasors, equal to Vmax/3, at three phases calculated to be $\theta-\Phi$ and $\theta+\Phi$, and $\theta$ respectively, whereby $\Phi=\cos^{-1}[(1.5 V/V_{MAX})-0.5]$, with V being the amplitude of the current complex time sample of the predetermined signal and Vmax being the maximum amplitude of the predetermined signal over the period of said sequence.

In accordance with another aspect of the invention the deconstruction circuit may comprise a virtual range-hopping engine configured for shifting a peak signal output from the Inverse Fourier transform processor to time samples targeted for attenuation by a preselected windowing function. Preconditioning of a predetermined signal may be performed by this virtual range-hopping engine. Alternatively, preconditioning of a predetermined signal may be performed by a light windowing engine configured for omitting the foregoing shifting of a peak but including the foregoing attenuation by a preselected windowing function.

BRIEF DESCRIPTION OF THE DRAWINGS

The foregoing exemplary embodiments of the invention will now be described in detail with reference to the following drawings which particularly pertain, by way of example, to an 802.11a wireless transmitter design (but it is to be understood that the invention is not limited to such specific application and may be appropriately applied to wireline or wireless applications, as desired).

DETAILED DESCRIPTION OF ILLUSTRATED EMBODIMENTS

In accordance with the invention claimed herein preconditioning and/or complementary computational signal processing engines are added to the standard computational processing performed by DSP (digital signal processor) modulators in transmitter circuitry (wireless or wireline). These processing engines deconstruct a predetermined modulation waveform into components which are referred to herein as fragment signals. Advantageously, these fragment signals individually have low peak-to-average power ratios for which multiple identical analog circuits, having low dynamic ranges and small power back-offs, may be used. Surprisingly, the inventor has found that Class S power amplifiers and, for wireless applications, low compression-point up-converters, may thereby be used and this represents a marked and substantial improvement over known computational circuits used for non-constant envelope modulation schemes. Following analog circuit processing the deconstructed signal components (i.e. fragment signals) are recombined to form the predetermined modulation waveform (being a multi-carrier OFDM modulation waveform in the illustrated example of an 802.11a transmitter). It is to be understood that the exemplary use of an OFDM modulator is not intended to limit the scope of the invention to such multi-carrier modulators and, in an alternative embodiment, the invention may be appropriately applied to other non-constant envelope modulation schemes including single carrier QAM computational modulators.

The references herein to "deconstructing" a predetermined signal mean that a signal (which may be characterized as a relatively "ill-behaved" waveform) is processed to transform it into a corresponding signal and/or subdivide it into fragment (i.e. deconstructed) signals which may be characterized as "better-behaved" signal(s), from the standpoint of the end-to-end limitations of a signal transport channel. For convenience, the signal on which the deconstruction engines described herein operate on is referred to herein as a predetermined signal or, for the carrier sorting engine, is alternatively referred to as a pre-modulation signal.

Figure 1A:
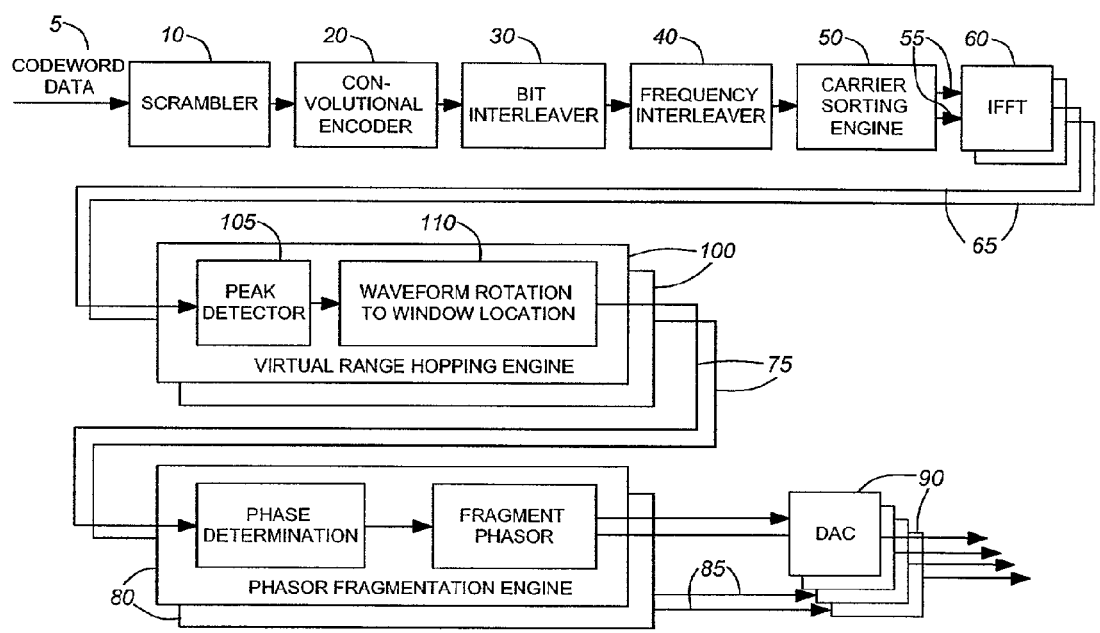
FIGS. 1(*a*) and 1(*b*) are block diagrams of components of radio transmitters including signal deconstruction engines for preconditioning and complementing digitally generated modulation processing in accordance with the invention, wherein FIG. 1(*a*) illustrates the use of a virtual range hopping engine for preconditioning and FIG. 1(*b*) illustrates an alternative signal processing function used for such preconditioning, namely, a light windowing engine.
Figure 1B:
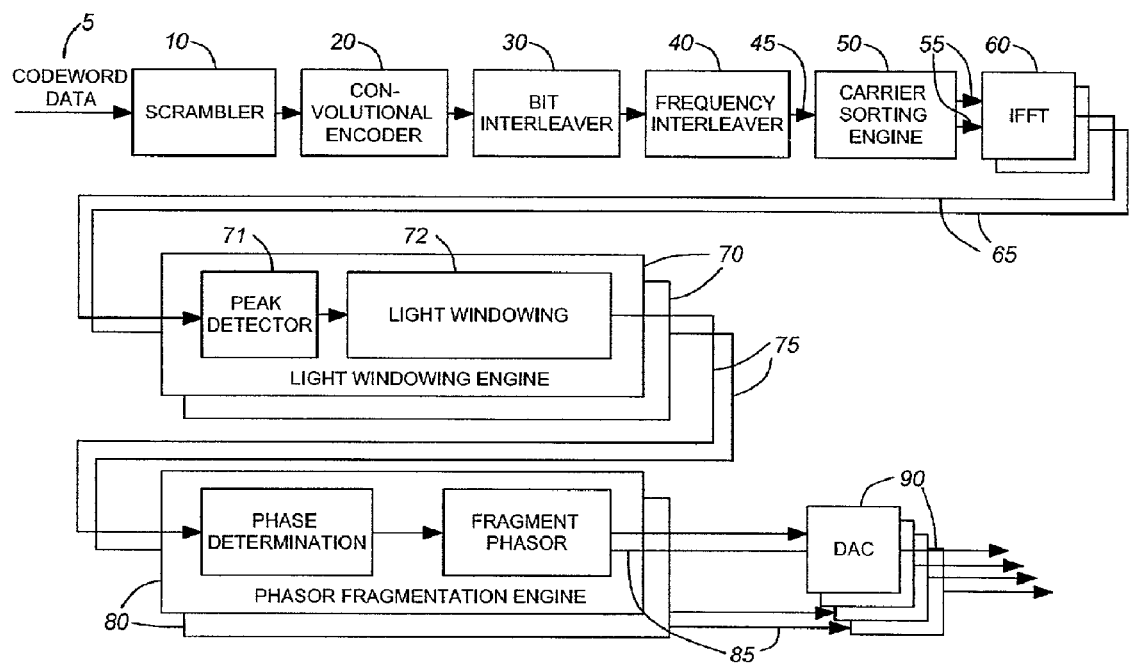

FIGS. 1(*a*) and (*b*) are block diagrams of transmitter configurations including signal deconstruction engines in accordance with the invention for preconditioning and complementing digitally generated modulation processing. In each of these illustrated embodiments a carrier sorting engine 50 according to one aspect of the invention preconditions the pre-modulation signal 45 following processing of the input signal 5 by a scrambler 10, an encoder 20 and bit and frequency interleaver processing blocks 30, 40. The carrier sorting engine 50 deconstructs the signal 45 into two fragment signals 55, each having lower peak-to-average ratios, which are input to IFFT's 60. Advantageously, each fragment signal 55 does not require as large an IFFT 60 as would be required by the pre-modulation signal 45 itself (i.e. without this preconditioning) so each IFFT 60 can be relatively small. Following the preconditioning by the carrier sorting engine 50, and transformation by the IFFT's, the modulation signals 65 are, in these exemplary embodiments, again preconditioned by a virtual range hopping engine 100, in the case of the embodiment of FIG. 1(a), or a light windowing engine 70, in the case of the embodiment of FIG. 1(b), to remove peaks therefrom (whereby the light windowing engine 70 may be preferred for use where a lesser attenuation amount is satisfactory). The signals 75 output from the virtual range hopping or light windowing engines are deconstructed by phasor fragmentation engines 80 and the resulting fragment signals 85 output therefrom are input to digital-to-analog converters (DACs) 90.

Each of the signal deconstruction processing engines 50, 80 realizes a multiplicity of output fragment signals from an input predetermined signal, and the output fragment signals produced by each engine 50, 70, 80 and 100 has a better peak-to-average power ratio than the predetermined signal input thereto. For the carrier sorting engine 50 the deconstructing operations take place in the frequency domain (preceding the IFFT operation) and for the, virtual range hopping, light windowing and phasor fragmentation engines the deconstructing operations take place in the time domain (following the IFFT operation). The fragment signals output from these deconstruction engines need not be orthogonal. However, the deconstruction operations must be linear in nature, to enable reconstruction of the output fragment signals 85, following power amplification, to a signal which corresponds to the predetermined signal from which they were derived.

Figure 2A:
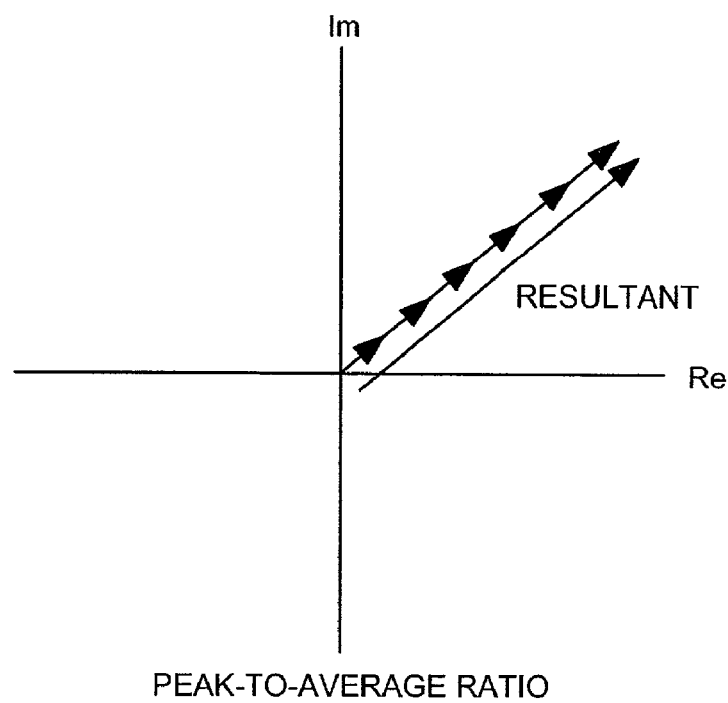
FIGS. 2(*a*) and (*b*) are vector diagrams illustrating the addition of individual phasors (carrier signals) to produce predetermined peak (FIG. 2(*a*)) and average (FIG. 2(*b*)) power levels for the peak-to-average power ratio.
Figure 2B:
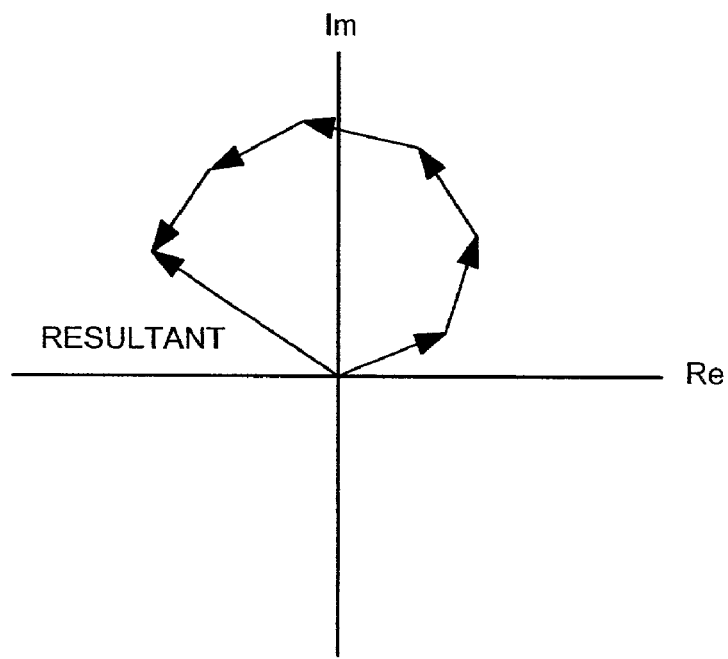
Figure 3:
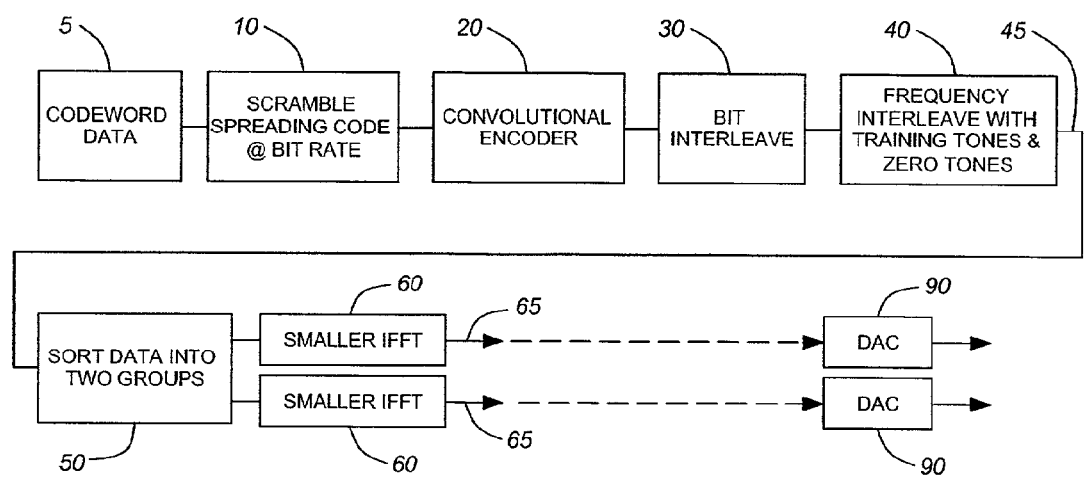
FIG. 3 is a block diagram illustrating the steps performed by a carrier-sorting signal processing engine as part of an overall OFDM modulator.

A carrier-sorting signal processing engine according to one aspect of the invention is illustrated by FIGS. 2 and 3. In the frequency domain, this engine sorts the carriers of a multicarrier OFDM modulation signal 45 into two or more groups (two groups being used for the illustrated embodiment), each of which possesses an improved peak-to-average power ratio. For modulation schemes such as OFDM, the peak-to-average power ratio produced is a result of the individual phasors adding "in-phase" during the time of a peak (see FIG. 2(a)), but adding "randomly" at other times (see FIG. 2(b)). At times other than the peak, the summation of the powers of the individual phasors (carriers) to form the total power of the signal, corresponds to the summation of the square roots of the individual phasor magnitudes.

The difference between the summation of the phasor magnitudes (at the time of the peak) and the summation of the square root of the phasor magnitudes (at all other times) increases with the number of elements in the OFDM transform. For a given size of transform this difference is reduced by sorting the complex elements being applied to the transform (modulation for the individual carriers) into two (or more) groups. These groups are then applied to two (or more) smaller transforms (IFFT's), each having an appropriate scaling factor to account for the "missing" elements.

Referring to FIG. 3, the sequence of complex elements at the input to an IFFT engine is sorted into even and odd sequence-number groups (even and odd sequence-numbered carriers) and applied to two smaller IFFT engines. The resulting peak-to-average power ratio for each IFFT output is 3 dB smaller than that of the single, larger IFFT engine which would be required in the absence of such carrier-sorting processing. When the carrier sorting engine 50 is used as a preconditioning engine according to the embodiment illustrated by FIG. 1, the two IFFT outputs 65 are applied to a complementary phasor fragmentation engine 80 (and, as illustrated, a light windowing engine 70 may, optionally, also precondition the outputs 65 before they are input to the phasor fragmentation engine 80). Alternatively, for a different embodiment it may be desired to use only the carrier sorting engine in which case the outputs 65 could be fed directly to digital-to-analog converters 90 (per the dotted lining in FIG. 3) and following the digital-to-analog converters 90 to parallel up-converters (for the illustrated wireless 802.11a application) and power amplifiers (having 3 dB less dynamic range and back-off requirements) before being combined just prior to transmission.

Optionally, it may be preferred to include an improvement over the foregoing single sorting algorithm of the carrier sorting engine 50, whereby the carriers (for any given group of a number of groups) are sorted in more than one way, simultaneously, and the resulting assortments of signals are assessed and then the group which has the best peak-to-average power ratio is selected as an output signal 55.

Figure 4A:
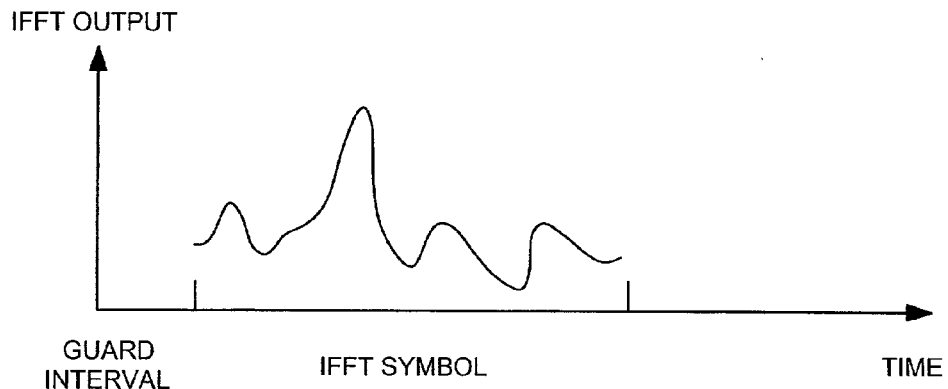
FIGS. 4(*a*), (*b*) and (*c*) are graphs illustrating the application of a light windowing function (b) to a symbol output from an IFFT (a) to attenuate a high peak within the symbol (c)
Figure 4B:
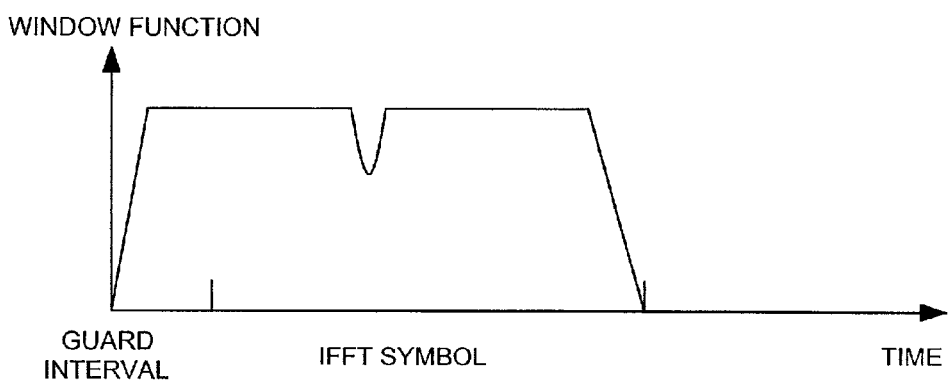
Figure 4C:
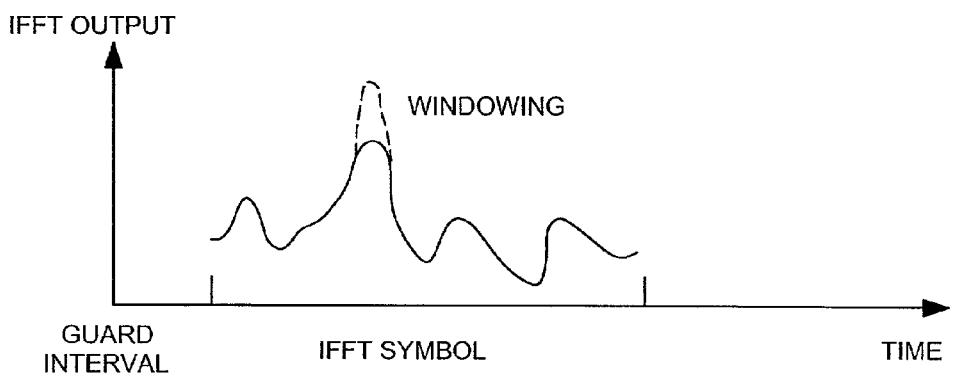

FIGS. 4(a), (b) and (c) are graphs illustrating the processing performed by the optional preconditioning light windowing engine 70 which is shown in FIG. 1(b). This engine includes a peak detector component 71 and a light windowing component 72. FIG. 4(a) illustrates a time sequence output from an IFFT 60 and FIG. 4(b) illustrates a light window function calculated by the engine 70 on the basis of a peak value of the time sequence as determined by the peak detector component 71. FIG. 4(c) shows the resulting time sequence after the light window function has been applied to it whereby the high peak shown in FIG. 4(a) is attenuated.

The optional virtual range hopping engine 100, which is shown in the embodiment of FIG. 1(a) for use as a preconditioning engine, is described in detail below with reference to FIGS. 9(a), (b) and (c) and 10.

Deconstruction signal processors in accordance with further aspects of the invention are illustrated by FIGS. 5, 6, 7 and 8. These processors are referred to herein as phasor fragmentation engines and, because they are computational processes, their signal processing complements that of the digital modulation processing (being OFDM in the illustrated embodiment but this is equally true for QAM). As such, these engines enable the efficient use of power efficient, dynamic-range limited RF circuits, namely, Class S power amplifiers and low compression-point up-converters (in the case of a wireless application).

The phasor fragmentation engines make use of the property of the isosceles triangle and include phase determination and phasor fragment processing components. They convert a predetermined signal (viz. an original phasor) having amplitude and phase variation, to two signals (viz. fragment phasors) each having a predetermined reduction in amplitude variation. In the limit, the amplitude variation is reduced to zero. The resulting reduced peak-to-average power ratio on each fragment phasor results in an increase in the rate of phase modulation experienced (because it is inherent to these engines that the greater the reduction in peak-to-average power ratio the greater will be the increase in phase modulation rate (bandwidth)).

Figure 5A:
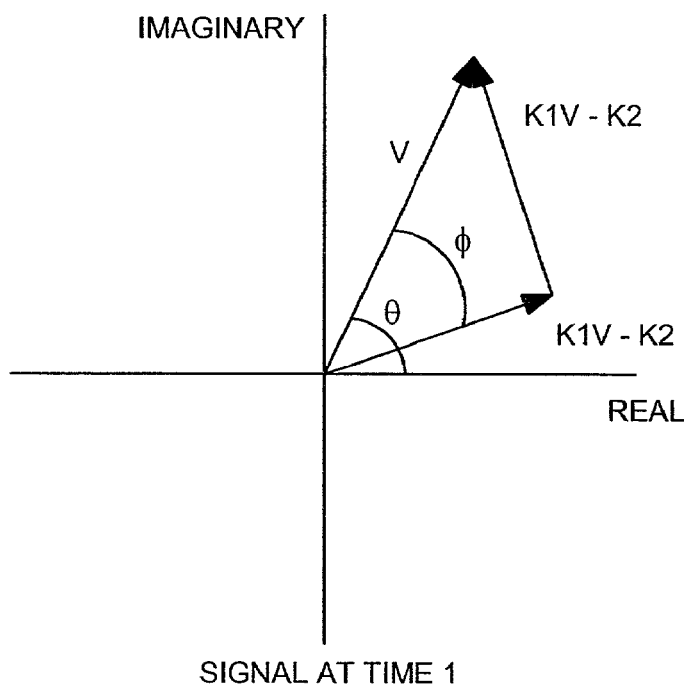
FIGS. 5(*a*) and (*b*) illustrate two vector diagrams of a predetermined (desired) phasor V (being a modulation signal), each at a different time ((a) and (b)), showing representations of the predetermined phasor V as the sum of two equal magnitude fragment phasors (K1 V–K2) which are continuously rotated to track the time varying magnitude and phase of the predetermined phasor whereby the magnitude of the two fragment phasors is dependent on the value of V (and, thus, is continuously adjusted)

A first embodiment of a phasor fragmentation engine is illustrated by FIGS. 5(a) and (b) and 6. FIGS. 5(a) and (b) illustrate two vector diagrams of a predetermined phasor V (i.e. a modulation signal), each at a different time ((a) and (b)), showing representations of the predetermined phasor V as the sum of two equal amplitude fragment phasors (K1 V−K2) which are continuously rotated to track the time varying amplitude and phase of the desired phasor. Each of the two fragment phasors has its amplitude continuously adjusted to a predetermined proportion of the predetermined signal's amplitude variation about its mean. As such, the fragment phasors' peak-to-average ratios are reduced to the predetermined proportion.

Figure 5B:
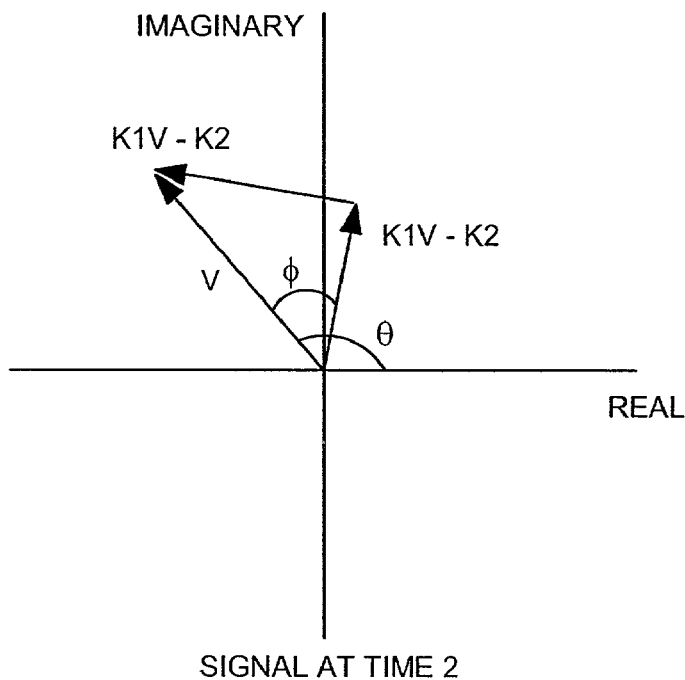
Figure 6:
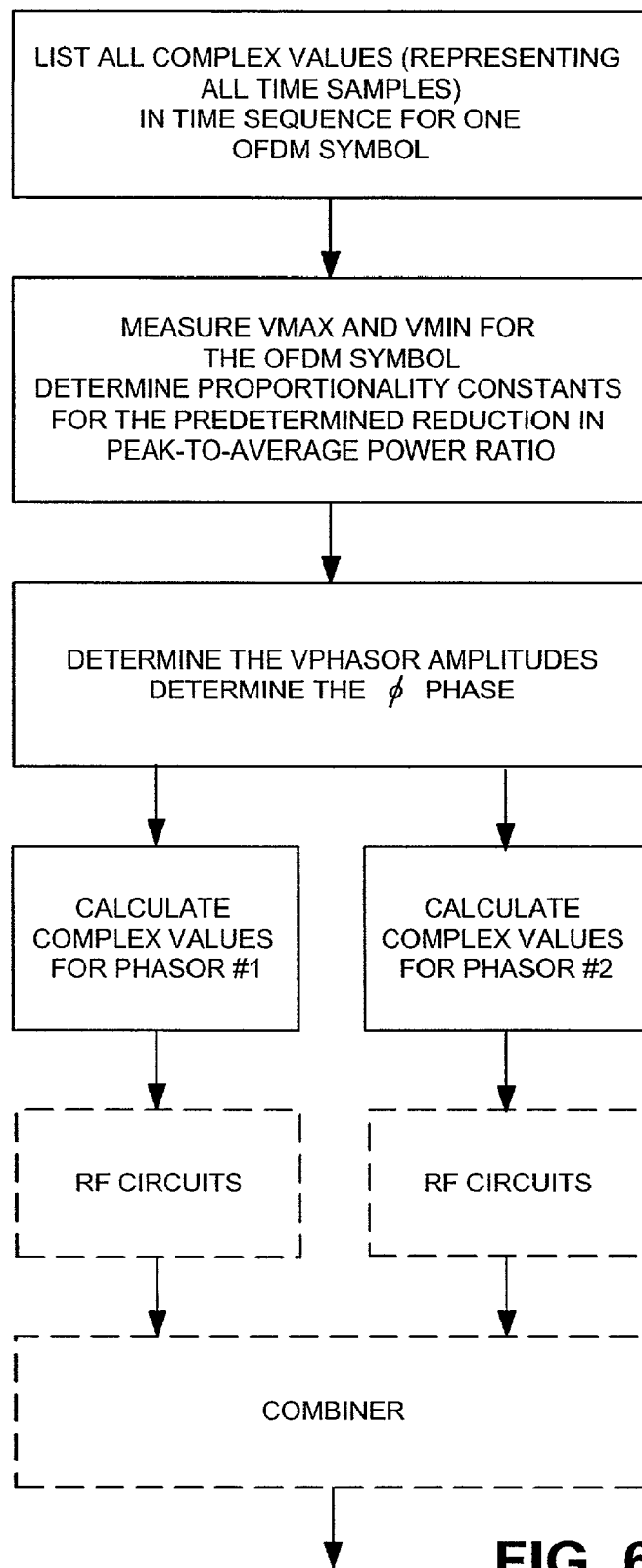
FIG. 6 is a flow chart illustrating the computational steps performed by a digital signal processor to produce the two fragment phasors shown in FIG. 5 (and with the RF circuits of a wireless transmitter shown in dotted outline)

As shown in FIG. 5, the magnitude of the two fragment phasors is calculated as (K1 V−K2) and, because it is dependent on the value of V, the magnitude varies and is continuously adjusted as V changes. FIG. 6 illustrates the computational steps performed by a digital signal processor to produce the two fragment phasors shown in FIG. 5. The illustrated embodiment shows the use of two fragment phasors but an alternative embodiment may provide for more than two as appropriate.

For computationally generated OFDM or QAM signals, the predetermined signal (being the modulated signal) is a sequence of complex (magnitude and phase) time samples. The phasor fragmentation engine converts this sequence to parallel sequences for the two phasors (carriers). A preferred linear equation providing the predetermined proportion for the fragment phasor amplitudes is the following:

$$V_{PHASOR} = aV_{MAX}(V-V_{MIN})/(V_{MAX}-V_{MIN}) + bV_{MIN}$$
$$(V_{MAX}-V)/(V_{MAX}-V_{MIN}) = K1 V - K2$$

wherein, $V_{PHASOR}$ is the amplitude (i.e. magnitude) of each of the two phasors $V_{MAX}$ is the maximum amplitude of the modulated signal V is the current amplitude of the modulated signal $V_{MIN}$ is the minimum amplitude of the modulated signal a and b; and K1 and K2, are constants By assigning a=0.5 and b=1.0 in the above equation a 6 dB reduction in the peak-to-average power ratio is achieved.

The phasor fragmentation engine illustrated by FIGS. 5 and 6 also adds and subtracts to the phase theta. of the predetermined signal V at each time sample, to create the two phases for the phasors. The corresponding phase equation is:

$$\Phi = \cos^{-1}(0.5 V/V_{PHASOR})$$

Figure 7A:
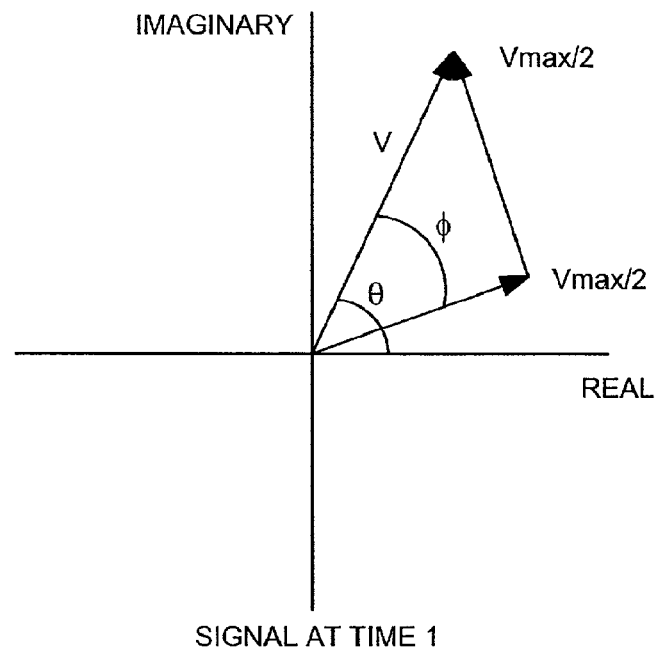
FIGS. 7(*a*) and (*b*) illustrate two vector diagrams of a predetermined phasor V (being a modulation signal), each at a different time ((a) and (b)), showing representations of the predetermined phasor V as the sum of two equal magnitude fragment phasors (Vmax/2) which are continuously rotated to track the time varying magnitude and phase of the predetermined phasor whereby the magnitude of the two fragment phasors is dependent on the maximum magnitude of V over the period of the sample (and is, thus, constant)
Figure 7B:
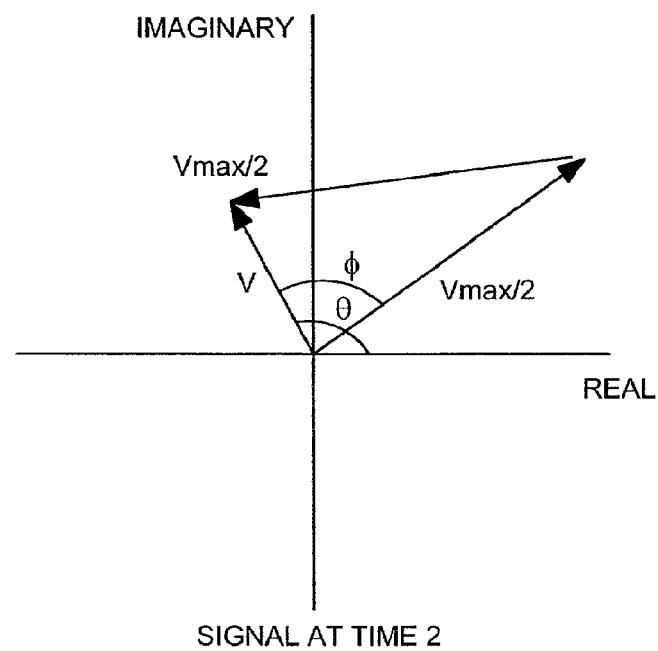

A second embodiment of a phasor fragmentation engine in accordance with another aspect of the invention is illustrated by FIGS. 7(a) and (b). As shown in these figures (wherein (a) represents one point in time and (b) represents another point in time) two equal, fixed magnitude phasors (Vmax/2) are continuously rotated in order to track the time varying magnitude and phase of the predetermined (modulation) signal V. The magnitude of the two fragment phasors is dependent on the maximum magnitude of V over the period of the sample and is, therefore, constant.

The amplitude for the two equal magnitude fragment phasors is:

$$V_{PHASOR} = V_{MAX}/2$$

To the phase at each time sample, this phasor fragmentation engine adds and subtracts .phi. whereby:

$$\Phi = \cos^{-1}(V/V_{MAX})$$

In this embodiment, because the two fragment phasors are of constant magnitude, low dynamic range (low compression point) up-converters can be used. Further, highly efficient S Class power amplifiers can be used, providing no-backoff amplification.

Figure 8A:
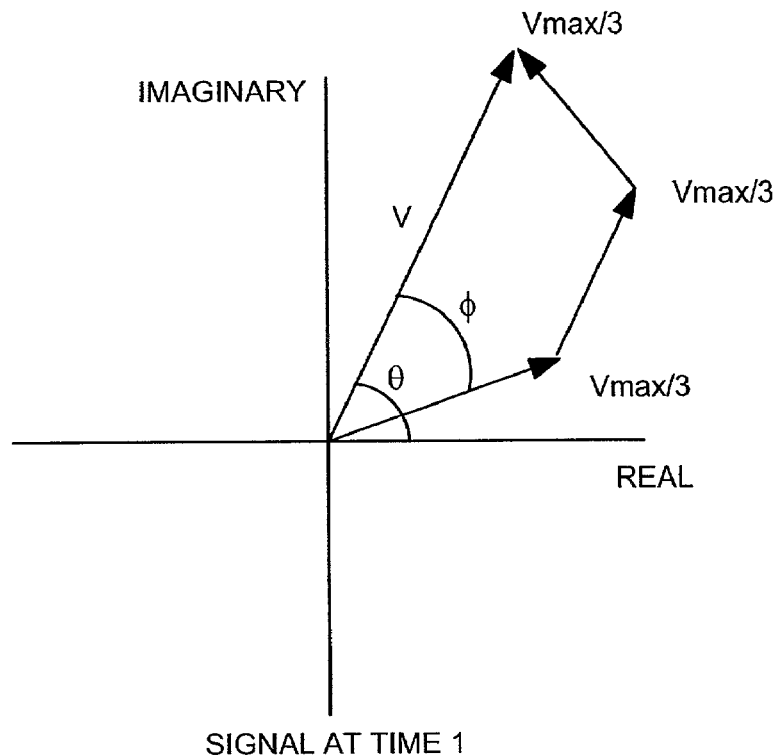
FIGS. 8(*a*) and (*b*) illustrate two vector diagrams of a predetermined phasor V (being a modulation signal), each at a different time ((a) and (b)), showing representations of the predetermined phasor V as the sum of three equal magnitude fragment phasors (Vmax/3) which are continuously rotated to track the time varying magnitude and phase of the predetermined phasor whereby the magnitude of the three fragment phasors is dependent on the maximum magnitude of V over the period of the sample (and is, thus, constant)
Figure 8B:
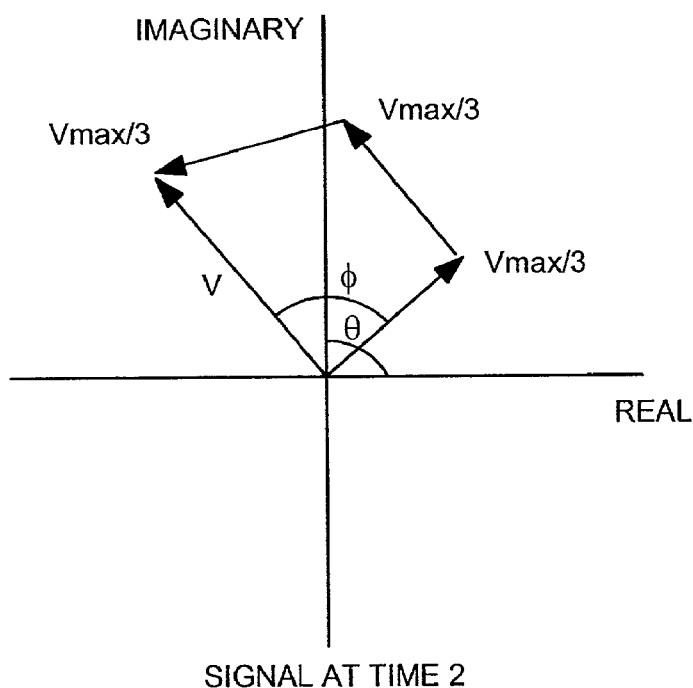

A third embodiment of a phasor fragmentation engine in accordance with another aspect of the invention is illustrated by FIGS. 8(a) and (b). As shown in these figures (wherein (a) represents one point in time and (b) represents another point in time), three equal, fixed magnitude phasors (Vmax/3) are continuously rotated in order to track the time varying magnitude and phase of the predetermined (modulation) signal V. The magnitude of the three fragment phasors is dependent on the maximum magnitude of V over the period of the sample and is, therefore, constant. This embodiment of a phasor fragmentation engine makes use of the property of isosceles triangles as well as that of coherent and incoherent signal addition.

The amplitude for the three equal magnitude phasors is:

$$V_{PHASOR} = V_{MAX}/3$$

To the phase .theta. at each time sample, the phasor fragmentation engine adds and subtracts .phi. to form the phase of two of the three phasors, whereby:

$$\Phi = \cos^{-1}[(1.5 V/V_{MAX}) - 0.5]$$

For the third fragment phasor, its phase is the phase θ of the phasor V at each time sample.

The phase Φ is analytically dependent on the instantaneous amplitude of the phasor V and behaves pseudo-randomly. Since this phase is added to and subtracted from the phase of phasor V to form two of the fragment phasors, those two phasors effectively behave as being statistically independent. Further, since the remaining (third) fragment phasor is not affected by Φ it will also behave as being statistically independent with respect to the other two fragment phasors.

When added together, these three statistically independent signals add on an individual power basis. However, on occasion the phases of the signals will align, and the signals will add on an individual amplitude basis. As a result, the three fragment signals when added together will result in a combined signal having a peak-to-average power ratio of 4.8 dB, without any inherent loss of power. Therefore, a signal having a peak-to-average ratio of up to 4.8 dB can be deconstructed into three phasors using this embodiment of the phasor fragmentation engine without sustaining any loss of power upon recombining.

In this embodiment, because the three fragment phasors are of constant magnitude, low dynamic range (low compression point) up-converters can be used. Further, highly efficient S Class power amplifiers can be used, providing no-backoff amplification.

Advantageously, the foregoing second and third embodiments of the phasor fragmentation engine are able to deconstruct a modulation signal having a peak-to-average power ratio of 3 dB or less, and 4.8 dB or less, respectively, and theoretically the fragment phasors can be recombined with 100% efficiency (i.e. no loss).

Further, it is to be noted that for very high peak-to-average power ratio signals, the efficiency of the foregoing second and third embodiment of the phasor fragmentation engine may suffer since the two or three phasors will frequently be near opposition (to generate the small average signal levels). However, when this second or third embodiment is used in conjunction with other peak-to-average power ratio reduction techniques such as the first foregoing embodiment of the phasor fragmentation engine, the foregoing carrier sorting engine and/or the virtual range-hopping engine described below (or for some embodiments the foregoing light windowing engine), the overall resulting efficiency is high.

It is to be noted that for OFDM modulation each symbol period (resulting from an IFFT operation) will have a different peak value. It follows then that for the phasor fragmentation engine, each symbol period can be individually scaled. This dynamic scaling enhances the overall bit-error rate performance of an OFDM link.

The carrier-sorting engine and the phasor-fragmentation engine reduce the peak-to-average power ratio of waveforms such as OFDM without compromising the air interface standard for a wireless application, by applying modified signals to parallel up-converter/power amplifier chains. Upon power combining, the OFDM waveform is regenerated. In order to ensure the regenerated OFDM waveform is not distorted, it is preferred that appropriate calibration and/or predistortion circuits be used to compensate for differences in channel gains and phases.

Figure 9A:
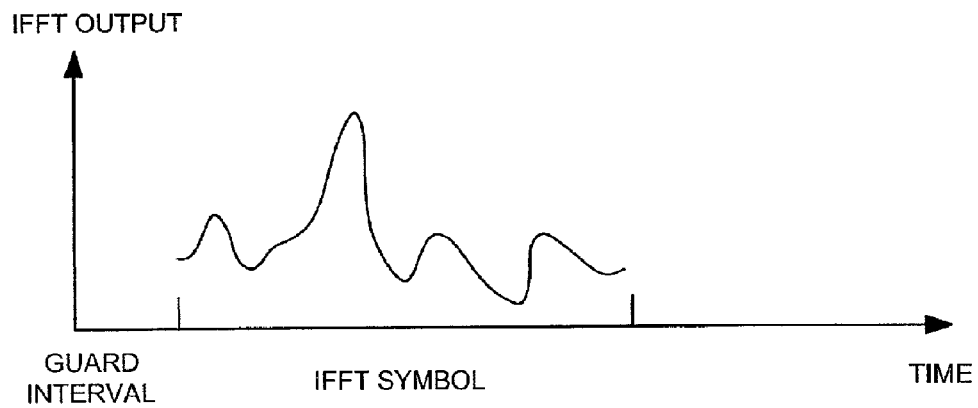
FIGS. 9(*a*), (*b*) and (*c*) are graphs illustrating the processing performed by a virtual range-hopping signal processing engine, FIG. 9(*a*) showing a time sequence output for an IFFT operation and a peak occurring therein, FIG. 9(*b*) showing a trapezoidal symbol windowing function which includes a light windowing function in the guard interval and FIG. 9(*c*) showing a shifting of the time sequence output to a point at which the peak lines up with the declining slope of the sample window so as to attenuate the peak (and the repeated peak within the guard interval is also attenuated by the light windowing function); and, FIG. 10 is a block diagram illustrating the steps performed by a virtual range-hopping signal processing engine as part of an overall OFDM modulator.
Figure 9B:
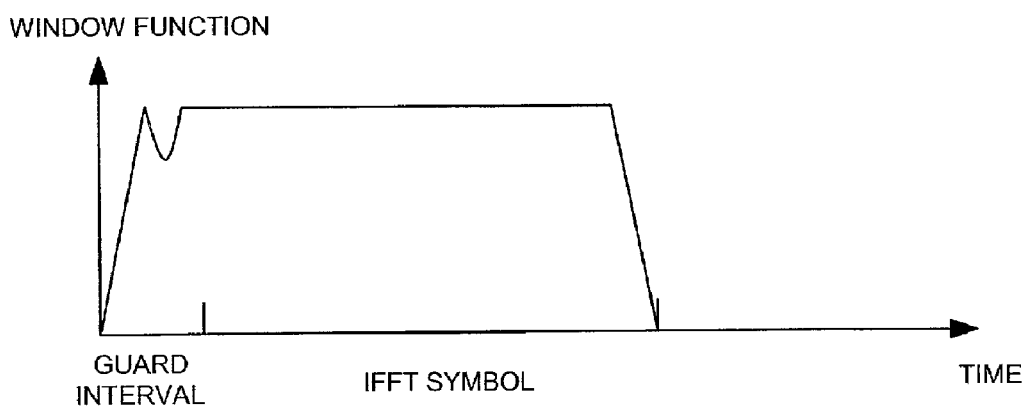
Figure 9C:
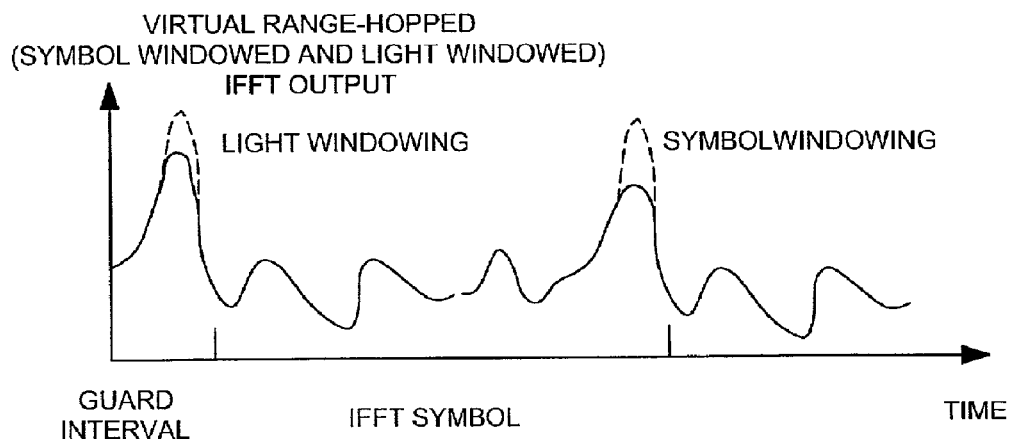
Figure 10:
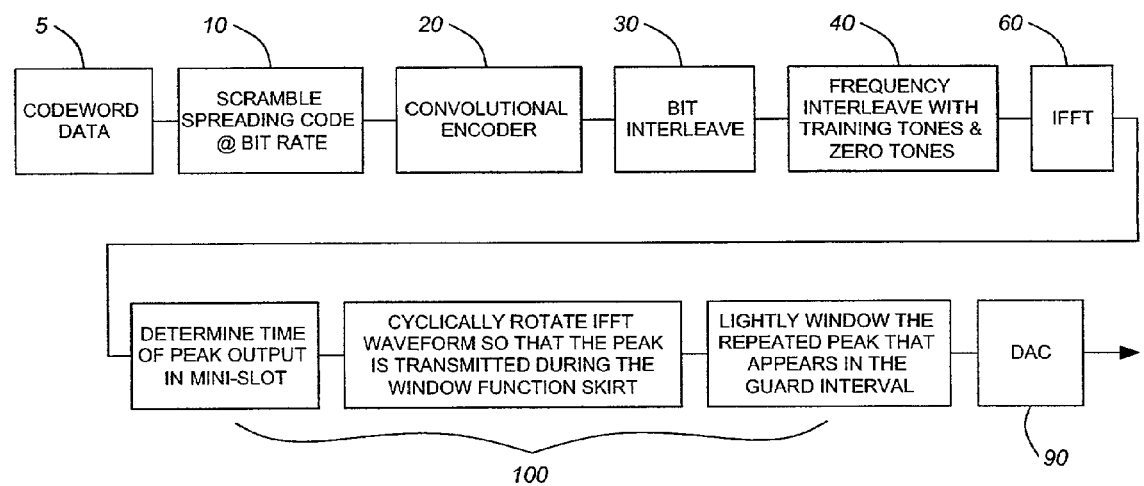

A further embodiment of the invention, referred to herein as the "virtual range hopping" signal deconstruction engine 100, is illustrated by FIGS. 9(a), (b) and (c) and 10. In addition, FIG. 1(a) illustrates a use of this engine as a preconditioning engine in combination with a carrier sorting engine, prior to a phasor fragmentation engine. FIG. 9(a) shows a time sequence output for an IFFT operation and a peak occurring therein. FIG. 9(b) shows a trapezoidal symbol windowing function which includes a light windowing function in the guard interval. FIG. 9(c) shows a shifting of the time sequence output to a point at which the peak lines up with the declining slope of the sample window so as to attenuate the peak (and the repeated peak within the guard interval is also attenuated by the light windowing function). FIG. 10 is a block diagram illustrating the steps performed by a virtual range-hopping signal processing engine as part of an overall OFDM modulator.

The virtual range hopping engine includes a peak detector component 105 for detecting a peak within a time sequence and a waveform rotation component 110 for shifting a detected peak to a pre-selected window location for attenuation. The time waveform segment generated by the IFFT operation is cyclically rotated (in accordance with the shifting property referenced above this occurs without loss of signal information) in order to place the peak signal value into the windowing function and thereby reduce the peak-to-average power ratio. As shown by FIGS. 9(a), (b) and (c), the shifting property is used to move the peak output during an IFFT operation to the time samples corresponding to the windowing function skirt. In this example, the peak is situated on the time sample having a weighting of 0.5 so its magnitude is decreased to one half and its power decreased by 6 dB. A peak moved to the trailing window function skirt will also appear in the leading guard interval and, as shown by FIG. 9(c) this peak can be attenuated using light windowing to a reduced level without disturbing the samples of the IFFT symbol period.

For other, more aggressive windowing functions the attenuation of the peak can be made even greater. As well, peaks that exist over more than one time sample can be handled with more aggressive windowing functions. The time shifting of the IFFT outputs will differ for each IFFT operation. The correct phase references for demodulation are obtained from the training tone phases. The result of this regular shifting of time is a virtual hopping in range for the transmitter. Each time sequence resulting from an IFFT operation will have a different peak value. After this peak value is moved to the windowing function for attenuation, a new lower peak will dominate. Each time segment can be scaled so that their respective peaks achieve the same value. Such dynamic scaling enhances the overall bit-error rate performance of the OFDM link.

The individual electronic and processing functions utilised in the foregoing described embodiments are, individually, well understood by those skilled in the art. It is to be understood by the reader that a variety of other implementations may be devised by skilled persons for substitution. Persons skilled in the field of communication design will be readily able to apply the present invention to an appropriate implementation for a given application.

Consequently, it is to be understood that the particular embodiments shown and described herein by way of illustration are not intended to limit the scope of the invention claimed by the inventor which is defined by the appended claims.

The invention claimed is:

1. An apparatus comprising:
a first deconstruction circuit configured to deconstruct a received signal into one or more first fragment signals;
a modulation circuit configured to provide one or more modulated signals based at least in part on the one or more first fragment signals received from said first deconstruction circuit; and
a second deconstruction circuit configured to deconstruct, in the time domain, the one or more modulated signals into two or more second fragment signals having substantially equal magnitudes that vary according to at least an amplitude of a current complex time sample of the received signal;
wherein said second deconstruction is further configured to deconstruct the one or more modulated signals into parallel sequences of said two or more second fragment signals at two or more phases;
wherein the two or more phases are given by $\theta-\phi$ and $\theta+\phi$;
wherein $\phi=\cos^{-1}(V/V_{MAX})$;
wherein V is a magnitude of the one or more modulated signals at a predetermined time; and
wherein $V_{MAX}$ is a maximum amplitude of the one or more modulated signals over a period of the parallel sequences.

2. The apparatus of claim 1, wherein at least one of the one or more first fragment signals includes a lower peak-to-average power ratio than a peak-to-average power ratio of the received signal.

3. The apparatus of claim 1, wherein said modulation circuit includes one or more inverse Fourier transform circuits configured to modulate the one or more first fragment signals.

4. The apparatus of claim 1, wherein said first deconstruction circuit includes a carrier-sorting engine configured to sort carriers of the received signal into the one or more first fragment signals.

5. The apparatus of claim 1, wherein said second deconstruction circuit includes a phasor fragmentation engine configured to cause the two or more second fragment signals to comprise a predetermined proportion of a corresponding amplitude of the one or more modulated signals about a corresponding mean amplitude of the one or more modulated signals.

6. The apparatus of claim 1, wherein said first deconstruction circuit includes a carrier-sorting engine configured to sort carriers of the received signal into two or more groups, each group possessing an improved peak to average power ratio.

7. The apparatus of claim 6, wherein said carrier-sorting engine is further configured to sort the carriers of the received signal into even and odd sequence number groups.

8. The apparatus of claim 6, wherein said carrier-sorting engine is further configured to add individual phasors in phase during a peak and randomly at other times.

9. The apparatus of claim 6, wherein said carrier-sorting engine is further configured to substantially simultaneously sort the carriers of the received signal into more than one group using one or more criteria.

10. The apparatus of claim 1, wherein said second deconstruction circuit includes a virtual range hopping engine configured to shift a peak signal output from said modulation circuit to one or more time samples capable of being attenuated by a windowing function.

11. The apparatus of claim 1, wherein said second deconstruction circuit includes a windowing engine configured to attenuate said one or more modulated signals with a windowing function.

12. The apparatus of claim 8, wherein said second deconstruction circuit includes a virtual range hopping engine configured to shift a peak signal output from said modulation circuit to one or more time samples capable of being attenuated by a windowing function.

13. The apparatus of claim 8, wherein said second deconstruction circuit includes a windowing engine configured to attenuate the one or more of the modulated signals with a windowing function.

14. An apparatus comprising:
  means for deconstructing a received signal having an undesired property into one or more first fragment signals, at least one of the one or more first fragment signals at least partially not having the undesirable property;
  means for modulating the one or more first fragment signals into one or ore modulated signals, the one or more modulated signals based at least in part on the one or more first fragment signals; and
  means for deconstructing the one or more modulated signals into two or more second fragment signals having substantially equal magnitudes that vary according to at least an amplitude of a current complex time sample of the received signal;
  wherein said means for deconstructing the one or more modulated signals is further configured to deconstruct the one or more modulated signals into parallel sequences of the two or more second fragment signals at two or more phases;
  wherein the two or more phases are given by $\theta-\phi$ and $\theta+\phi$;
  wherein $\phi=\cos^{-1}(V/V_{MAX})$;
  wherein V is a magnitude of the one or more modulated signals at a predetermined time; and
  wherein $V_{MAX}$ is a maximum amplitude of the one or more modulated signals over a period of the parallel sequences.

15. The apparatus of claim 14, wherein the undesirable property includes a higher peak-to-average power ratio.

16. The apparatus of claim 14, wherein said means for modulating includes means for transforming the one or more first fragment signals according an inverse Fourier transform into the one or more modulated signals.

17. The apparatus of claim 14, wherein said means for deconstructing the received signal includes means for sorting carriers of the received signal into the one or more first fragment signals.

18. The apparatus of claim 14, wherein said means for deconstructing the one or more modulated signals includes means for causing the two or more second fragment signals to comprise a predetermined portion of variation in the received signal about a mean amplitude of the received signal.

19. The apparatus of claim 14, further comprising:
  means for sorting carriers of the received signal into the one or more first fragment signals; and
  means for causing the one or more modulated signals to comprise a predetermined portion of variation in the received signal about a mean amplitude of the received signal.

20. The apparatus of claim 19, wherein said means for sorting the carriers of the received signal is further configured to sort the carriers of the received signal into two or more groups, each group possessing an improved peak to average power ratio.

21. The apparatus of claim 19, wherein said means for sorting the carriers of the received signal is further configured to add individual phasors in phase during a peak and randomly at other times.

22. The apparatus of claim 19, wherein said means for sorting the carriers of the received signal is further configured to substantially simultaneously sort the carriers of the received signal into more than one group using one or more criteria.

23. The apparatus of claim 14, wherein said means for deconstructing the one or more modulated signals includes means for shifting a peak signal output from said means for modulating to one or more time samples capable of being attenuated by means for performing a windowing function.

24. The apparatus of claim 14, wherein said means for deconstructing the one or more modulated signals includes means for attenuating the one or more modulated signals according to a windowing function.

25. The apparatus of claim 14, further comprising means for preconditioning the one or more modulated signals prior to deconstruction by said means for deconstructing the one or more modulated signals.

26. The apparatus of claim 25, wherein said means for preconditioning includes means for shifting a peak signal output from said means for modulating to one or more time samples capable of being attenuated by means for performing a windowing function.

27. A processor-implemented method for use in a transmitter, comprising:
  deconstructing a received signal having an undesired property into one or more first fragment signals, at least one of the one or more first fragment signals at least partially not having the undesirable property;
  modulating the one or more first fragment signals into one or more modulated signals, the one or more modulated signals based at least in part on the one or more first fragment signals; and
  deconstructing, in the time domain, the one or more modulated signals into parallel sequences of two or more varying magnitude second fragment signals at two or more phases;
  wherein the two or more phases are given by $\theta-\phi$ and $\theta+\phi$;
  wherein $\phi=\cos^{-1}(V/V_{MAX})$;
  wherein V is a magnitude of the one or more modulated signals at a predetermined time; and
  wherein $V_{MAX}$ is a maximum amplitude of the one or more modulated signals over a period of the parallel sequences.

28. The method of claim 27, wherein the undesirable property includes a higher peak-to-average power ratio.

29. The method of claim 27, wherein said modulating includes transforming the one or more first fragment signals according an inverse Fourier transform into the one or more modulated signals.

30. The method of claim 27, wherein said deconstructing the received signal includes sorting carriers of the received signal into the one or more first fragment signals.

31. The method of claim 27, wherein said deconstructing the one or more modulated signals includes causing the two or more varying magnitude second fragment signals to comprise a predetermined portion of variation in the received signal about a mean amplitude of the received signal.

32. The method of claim 27, comprising:
sorting carriers of the received signal into the one or more first fragment signals; and
causing the one or more modulated signals to comprise a predetermined portion of variation in the received signal about a mean amplitude of the received signal.

33. The method of claim 32, wherein said sorting the carriers of the received signal includes sorting the carriers of the received signal into two or more groups, each group possessing an improved peak to average power ratio.

34. The method of claim 32, wherein said sorting the carriers of the received signal includes adding individual phasors in phase during a peak and randomly at other times.

35. The method of claim 32, wherein said sorting the carriers of the received signal includes substantially simultaneously sorting the carriers of the received signal into more than one group using one or more criteria.

36. The method of claim 27, wherein said deconstructing the one or more modulated signals includes shifting a peak signal output from said modulating to one or more time samples capable of being attenuated by performing a windowing function.

37. The method of claim 27, wherein said deconstructing the one or more modulated signals includes attenuating the one or more modulated signals according to a windowing function.

38. The method of claim 27, further comprising preconditioning the one or more modulated signals prior to said deconstructing the one or more modulated signals.

39. The method of claim 38, further comprising:
shifting a peak signal output from said modulating to one or more time samples capable of being attenuated by performing a windowing function.

* * * * *

UNITED STATES PATENT AND TRADEMARK OFFICE
CERTIFICATE OF CORRECTION

PATENT NO.        : 7,733,976 B2
APPLICATION NO.   : 11/469062
DATED             : June 8, 2010
INVENTOR(S)       : James Stuart Wight It is certified that error appears in the above-identified patent and that said Letters Patent is hereby corrected as shown below:

On the Title page, item [56]:

Page 2, Column 1, line 14 (Other Publications):   Delete "Linearisers" and replace with --Linearizers--;

Page 2, Column 1, line 20 (Other Publications):   Delete "Xhang" and replace with --X Zhang--;

Page 2, Column 2, line 26 (Other Publications):   Delete "Eberlee" and replace with --W. Eberle--;

Column 13, line 23 (Claim 14):   Delete "ore" and replace with --more--; and

Column 14, line 27 (Claim 27):   Delete "$(V/V_{MAX};)$" and replace with --$(V/V_{MAX});$--.

Signed and Sealed this

Twenty-sixth Day of October, 2010

David J. Kappos
*Director of the United States Patent and Trademark Office*